(12) United States Patent
Xue

(10) Patent No.: US 10,389,222 B2
(45) Date of Patent: Aug. 20, 2019

(54) SYSTEMS AND METHODS FOR SENSING CURRENT IN A POWER CONVERTER

(71) Applicant: Apple Inc., Cupertino, CA (US)

(72) Inventor: Dashun Xue, Austin, TX (US)

(73) Assignee: Apple Inc., Cupertino, CA (US)

( * ) Notice: Subject to any disclaimer, the term of this patent is extended or adjusted under 35 U.S.C. 154(b) by 1 day.

(21) Appl. No.: 15/684,576

(22) Filed: Aug. 23, 2017

(65) Prior Publication Data
US 2019/0068046 A1 Feb. 28, 2019

(51) Int. Cl.
| | |
|---|---|
| *H02M 1/08* | (2006.01) |
| *H02M 3/158* | (2006.01) |
| *H02M 1/32* | (2007.01) |
| *G01R 17/02* | (2006.01) |
| *H02M 1/00* | (2006.01) |

(52) U.S. Cl.
CPC ............. *H02M 1/08* (2013.01); *G01R 17/02* (2013.01); *H02M 1/32* (2013.01); *H02M 3/158* (2013.01); *H02M 2001/0009* (2013.01)

(58) Field of Classification Search
None
See application file for complete search history.

(56) References Cited

U.S. PATENT DOCUMENTS

| | | | |
|---|---|---|---|
| 8,514,010 B2 | 8/2013 | Nagata | |
| 8,610,411 B2 | 12/2013 | Smith et al. | |
| 8,917,069 B2 | 12/2014 | Howes et al. | |
| 9,104,222 B2 | 8/2015 | Pigott | |
| 9,383,618 B2 | 7/2016 | Luff | |
| 9,748,842 B1* | 8/2017 | Devarajan | H02M 1/08 |
| 2010/0277142 A1* | 11/2010 | Tan | H02M 7/53803 323/268 |
| 2010/0308784 A1* | 12/2010 | Scoones | H02M 1/32 323/282 |
| 2015/0097542 A1 | 4/2015 | Repton et al. | |

FOREIGN PATENT DOCUMENTS

CN 102830741 B 3/2014

* cited by examiner

*Primary Examiner* — Alex Torres-Rivera
*Assistant Examiner* — Henry E Lee, III
(74) *Attorney, Agent, or Firm* — Meyertons Hood Kivlin Kowert and Goetzel PC; Rory D. Rankin

(57) ABSTRACT

Systems, apparatuses, and methods for efficiently generating a stable output voltage for one or more components are described. In various embodiments, current sensing circuitry within a power converter includes one or more current mirrors in addition to at least a first resistor, a second resistor, a switch and a bias current source. The sizes of these latter components scales the sensing current output of the current sensing circuitry from a value of an inductor current flowing through the low pass filter output of the power converter. In addition, the sizes generate an offset which maintains the sensing current as a positive value even when the inductor current becomes a negative value. The boosted sensing current makes a zero detection function and a protection function for the power converter relatively simple with current comparisons.

14 Claims, 8 Drawing Sheets

SYSTEMS AND METHODS FOR SENSING CURRENT IN A POWER CONVERTER

BACKGROUND

Technical Field

Embodiments described herein relate to the field of integrated circuits and, more particularly, to efficiently generating a stable output voltage for one or more components.

Description of the Related Art

A computing system such as a semiconductor chip includes multiple components, each capable of processing data. The multiple components include interface and functional blocks or units. In various embodiments, the multiple components are individual dies on one of a system on a chip (SOC), a multi-chip module (MCM) or a printed circuit board. Examples of components are general-purpose processors with one or more cores in a central processing unit (CPU), highly parallel data architected processors with one or more cores in graphics processing units (GPUs) and digital signal processors (DSPs), display controllers, audio processing components, networking components, peripheral interface controllers, memory controllers, and so on.

Control logic, such as a power management unit, within the computing system determines one or more operating states for the different components. The operating state includes a power supply voltage and an operational clock frequency. Clock generating circuitry generates different clock signals at the one or more specified different frequencies, whereas a power distribution network provides the one or more specified different power supply voltages. This on-chip network uses power supplies and regulation circuits to generate the specified different power supply voltages for use by the devices within the functional units. Additionally, the network relies on a pair of on-chip planes where one voltage plane (metal layer) is dedicated to the power supply voltage and another ground plane (metal layer) is dedicated to the ground value.

When devices in the components draw current from the power and ground planes, the changes in the demand of current creates both a current-resistance (IR) drop and a transient voltage drop. Additionally, for mobile devices, a voltage value provided by a battery reduces as the stored energy is consumed. Although the duration of the voltage variation may be temporary, the voltage variation causes unreliable behavior for the devices causing the variation and neighboring devices.

In view of the above, methods and mechanisms for efficiently generating a stable output voltage for one or more components are desired.

SUMMARY

Systems and methods for managing operating modes for efficiently generating a stable output voltage for one or more components are contemplated. In various embodiments, a power converter receives an input voltage and generates an output voltage on a capacitor of a low pass filter. The power converter includes two power transistors connected in series with an output connected to the low pass filter. A driver within the power converter turns on and off the two power transistors based on a control signal. A controller generates the control signal for the two power transistors based on at least a sensing current output by a current sensing block. In various embodiments, the sensing current is a shifted value of an inductor current flowing through the low pass filter.

The current sensing block includes a first resistor connected to a ground reference and receives on the other node each of a first current from a first bias current source and a second current from a source terminal of a current sink transistor of a first current mirror. In addition, the current sensing block includes a second resistor which receives a third current from a source terminal of a first diode-connected transistor of the first current mirror. The second resistor is also connected to a switching node through a switch when the switch is closed. The switching node is the output node of the two power transistors. The voltage of the switching node is based on the inductor current flowing through the low pass filter output of the power converter. Each of the first current from the first bias current source, the first resistor, the second resistor and the switch are used to generate the sensing current as a shifted value of the inductor current flowing through the low pass filter. For example, when the inductor current becomes a negative value, the sensing current remains as a positive value. Therefore, in various embodiments, the sensing current is used to make a zero detection function and a protection function for the power converter relatively simple. For example, each of the zero detection function and the protection function is performed with a relatively simple current signal comparison.

When the switch is closed, it sends the third current from the first diode-connected transistor of the first current mirror to the switching node. The closed switch also sends a fourth current to the switching node from a drain terminal of a second diode-connected transistor of a second current mirror. The sensing current is from a drain terminal of a first current sink transistor of the second current mirror. With matching device widths between the diode-connected transistor and the current sink transistor of the second current mirror, the sensing current is equal to the fourth current. With a non-unity ratio between the device widths, the sensing current is a scaled version of the fourth current based on the non-unity ratio. The sizes of the first resistor, the second resistor and the switch in addition to the amount of current in the first bias current source scales the sensing current from a value of the inductor current flowing through the low pass filter output of the power converter. In addition, the sizes generate an offset which maintains the sensing current as a positive value even when the inductor current becomes a negative value.

These and other embodiments will be further appreciated upon reference to the following description and drawings.

BRIEF DESCRIPTION OF THE DRAWINGS

The above and further advantages of the methods and mechanisms may be better understood by referring to the following description in conjunction with the accompanying drawings, in which.

Figure 1:
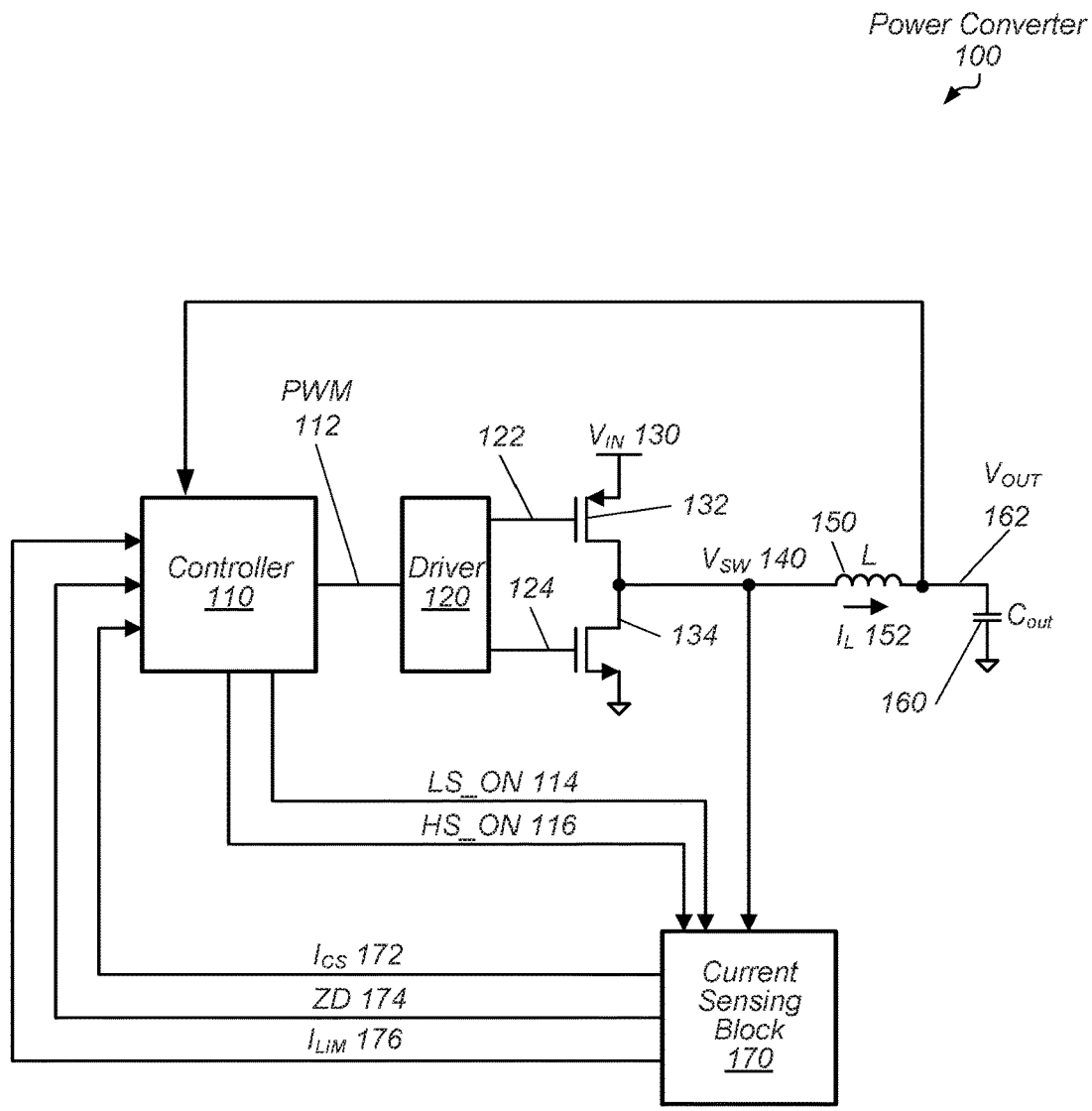
FIG. 1 is a block diagram of one embodiment of a power converter.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Turning now to FIG. 1, a generalized block diagram of one embodiment of a power converter 100 is shown. In the illustrated embodiment, the power converter 100 includes a controller 110, a driver 120, the high-side transistor 132, the low-side transistor 134, an inductor 150, a capacitor 160 and a current sensing block 170. In various embodiments, the controller 110 alternates turning on and off the transistors 132 and 134 through the driver 120. In some embodiments, each of the high-side transistor 132 and the low-side transistor 134 is a power field effect transistor (FET). For example, the high-side transistor 132 is a power p-type FET and the low-side transistor 134 is a power n-type FET. When the transistor 132 is on and the transistor 134 is off, current flows from the input voltage ($V_{IN}$) 130 through the inductor 150 and charges the capacitor 160. The current flows with a positive slope. In the alternate case, when the transistor 132 is off and the transistor 134 is on, the capacitor 160 is discharged. In the alternate case, most of the inductor current flows from the ground reference to the capacitor 160 and a relatively small portion of the current flows from the current sensing block 170 to the capacitor 160.

In various embodiments, the converter 100 converts the relatively high $V_{IN}$ 130 to a relatively smaller and regulated output voltage ($V_{OUT}$) 162. In some embodiments, the converter 100 is used within a mobile device in an attempt to maximize battery life while supplying the regulated $V_{OUT}$ 162. In an embodiments, the converter 100 provides the stepdown (buck) switching characteristics of a valley control, current mode Buck converter. In one embodiment, the controller 110 is a fixed-frequency pulse-width modulation (PWM) controller for direct current (DC) to DC converter applications. Since the controller 100 operates at a specified known frequency, the design of other circuitry for suppressing electromagnetic interference (EMI) becomes relatively simpler.

In some embodiments, the peak current through the inductor 150 is used to determine the size of the inductor 150, since both are related to the saturation-current rating of the inductor 150. The capacitor 160 minimizes voltage overshoot and ripple on $V_{OUT}$ 162. Sizing of the capacitor 160 depends on avoiding insufficient output capacitance, which causes both voltage overshoot and voltage ripple on $V_{OUT}$ 162. The voltage ripple is also dependent on a relatively high equivalent-series resistance (ESR) in the capacitor 160. Therefore, any series ESR is designed to be relatively low.

As used herein, when a value reaches a state for enabling evaluation, the value is determined to be asserted. In one example, the signal 122 having a logic low value enables the high side transistor 132 to conduct current and charge the output node on its drain terminal, which increases the voltage on the signal $V_{SW}$ 140. In such a case, the signal 122 is determined to be asserted. The logic low value is used as the state in this case to qualify the signal 122 as being asserted. In contrast, the signal 122 having a logic high value disables the high side transistor 132 from conducting current. In such a case, the signal 122 is determined to be negated.

In some embodiments, when the controller 110 generates a logic high value for the output signal PWM 112, the driver 120 simultaneously turns on the high side transistor 132 by asserting the signal 122 and turns off the low side transistor 134 by negating the signal 124. Conversely, when the controller 110 generates a logic low value for the output signal PWM 112, the driver 120 simultaneously turns off the high side transistor 132 by negating the signal 122 and turns on the low side transistor 134 by asserting the signal 124.

Due to the switching control from the controller 110, in some embodiments, the signal $V_{SW}$ 140 is a square waveform with a peak value of $V_{IN}$ 130 and a low value of the ground reference. The signal $V_{OUT}$ 162 is a filtered version of the signal $V_{SW}$ 140 and also dependent on the duty cycle of the signal $V_{SW}$ 140. For example, if the power supply $V_{IN}$ 130 has a value of 5 volts (V) and the controller 110 generates a square waveform for the signal $V_{SW}$ 140 with a 50% duty cycle, then the output signal $V_{OUT}$ 162 has a constant value of 2.5V, which is half of the power supply $V_{IN}$ 130. In another example, if the controller 110 generates a square waveform for the signal $V_{SW}$ 140 with a 30% duty cycle, then the output signal $V_{OUT}$ 162 has a constant value of 1.5V, which is 30% of the power supply $V_{IN}$ 130. The inductor 150 and the capacitor 160 are used as a low pass filter that provides an average voltage value of the signal $V_{SW}$ 140 on the output $V_{OUT}$ 162. In an embodiment, the controller 110 receives control signals (not shown) from an external power management unit, which are used to determine the duty cycle and the resulting value for $V_{OUT}$ 162.

In the illustrated embodiment, the current sensing block 170 receives three inputs, which are the switching voltage $V_{SW}$ 140, which is generated from inductor current, the digital signal referred to as high side on (HS_ON) 116, and the digital signal referred to as low side on (LS_ON) 114. The digital input HS_ON 116 is asserted when the high side transistor 132 is turned on by the output PWM 112 and the driver 120. As described earlier, when a value reaches a state for enabling evaluation, the value is determined to be asserted. In one example, the output HS_ON 116 having a logic high value enables circuitry in the current sensing block 170 to perform an evaluation based on the high side transistor 132 is turned on. In such a case, the HS_ON 116 is determined to be asserted. The logic high value is used as the state in this case to qualify the signal HS_ON 116 as being asserted. In other cases, a logic low value is used to qualify the signal HS_ON 116 as being asserted.

In contrast, when the output HS_ON 116 has a logic low value, in some embodiments, the output is determined to be negated since the circuitry in the current sensing block 170 no longer performs the evaluation based on the high side transistor 132 is turned on. Similarly, the digital input LS_ON 114 is asserted when the low side transistor 134 is turned on by the output PWM 112 and the driver 120. The asserted value (logic high value in this case) of the signal LS_ON 114 enables circuitry in the current sensing block 170 to perform an evaluation based on the low side transistor 134 is turned on. In an embodiment, the controller 110 uses a set-reset (SR) latch for generating the control signals HS_ON 116 and LS_ON 114.

In some embodiments, the signal $V_{SW}$ 140 follows the signal PWM 112. For example, when the signal PWM 112 transitions to a logic high value, the control logic in the driver 120 asserts the signal 122 to turn on the high side transistor 132 and negates the signal 124 to turn off the low side transistor 134. Consequently, the signal $V_{SW}$ 140 transitions to a logic high value. Conversely, when the signal PWM 112 transitions to a logic low value, the control logic in the driver 120 negates the signal 122 to turn off the high side transistor 132 and asserts the signal 124 to turn on the low side transistor 134. Consequently, the signal $V_{SW}$ 140 transitions to a logic low value.

The current sensing block 170 performs multiple functions which generates the three outputs values $I_{CS}$ 172, ZD 174 and $I_{LIM}$ 176. One function is the current sensing block 170 generates a replica current, which is referred to as $I_{CS}$ 172, to be proportional to the inductor current $I_L$ 152. In order to improve efficiency, the current sensing block 170 performs a zero detection (ZD) function for entering a power-save mode. The digital output ZD 174 is generated during this function. The current sensing block 170 also performs a protection function which protects the converter 100. In an embodiment, when $V_{OUT}$ 162 is greater than a threshold value, the current sensing block 170 generates the control signal $I_{LIM}$ 176 to initiate discharging the capacitor 160 by sinking current through the low side transistor 134. The three outputs $I_{CS}$ 172, ZD 174 and $I_{LIM}$ 176 of the current sensing block 170 are received by the controller 110, which generates the signal PWM 112 to switch on and off the transistors 132 and 134 through the driver 120 based on the current $I_L$ 152.

In some embodiments, the signal $V_{OUT}$ 162 is received by one or more components on a semiconductor chip. Examples of the one or more components are a central processing unit (CPU), a highly parallel data architected processor with one or more cores in graphics processing units (GPUs) and digital signal processors (DSPs), display controllers, audio processing components, networking components, peripheral interface controllers, memory controllers, and so on. In an embodiment, as long as the controller 110 determines a same duty cycle and the load current consumed by the one or more components remains the same, which makes inductor current $I_L$ 152 remain at a same value, the three outputs $I_{CS}$ 172, ZD 174 and $I_{LIM}$ 176 of the current sensing block 170 also remain the same. The average value of the inductor current $I_L$ 152 is the value of the supplied load current. Thus, if the load current does not change, then the inductor current $I_L$ 152 also does not change outside of changes to the duty cycle for the signal $V_{SW}$ 140. If the load current does change, since one or more components are activated or alternatively put to in a sleep mode, then the inductor current $I_L$ 152 also changes, which causes changes to one or more of the three outputs $I_{CS}$ 172, ZD 174 and $I_{LIM}$ 176 of the current sensing block 170.

The three functions (generating a replica current, zero detection, and protection) are typically achieved by three individual circuit blocks. However, in various embodiments, the three functions are achieved with the single current sensing block 170. By using a single circuit block, such as the current sensing block 170, each of on-die area, testing time, and current consumption, and thus, power consumption, is significantly reduced in both one-phase and multi-phase converters. Before providing a further description of the current sensing block 170, the signal waveforms for the converter 100 for multiple modes of operations are first described.

Figure 2:
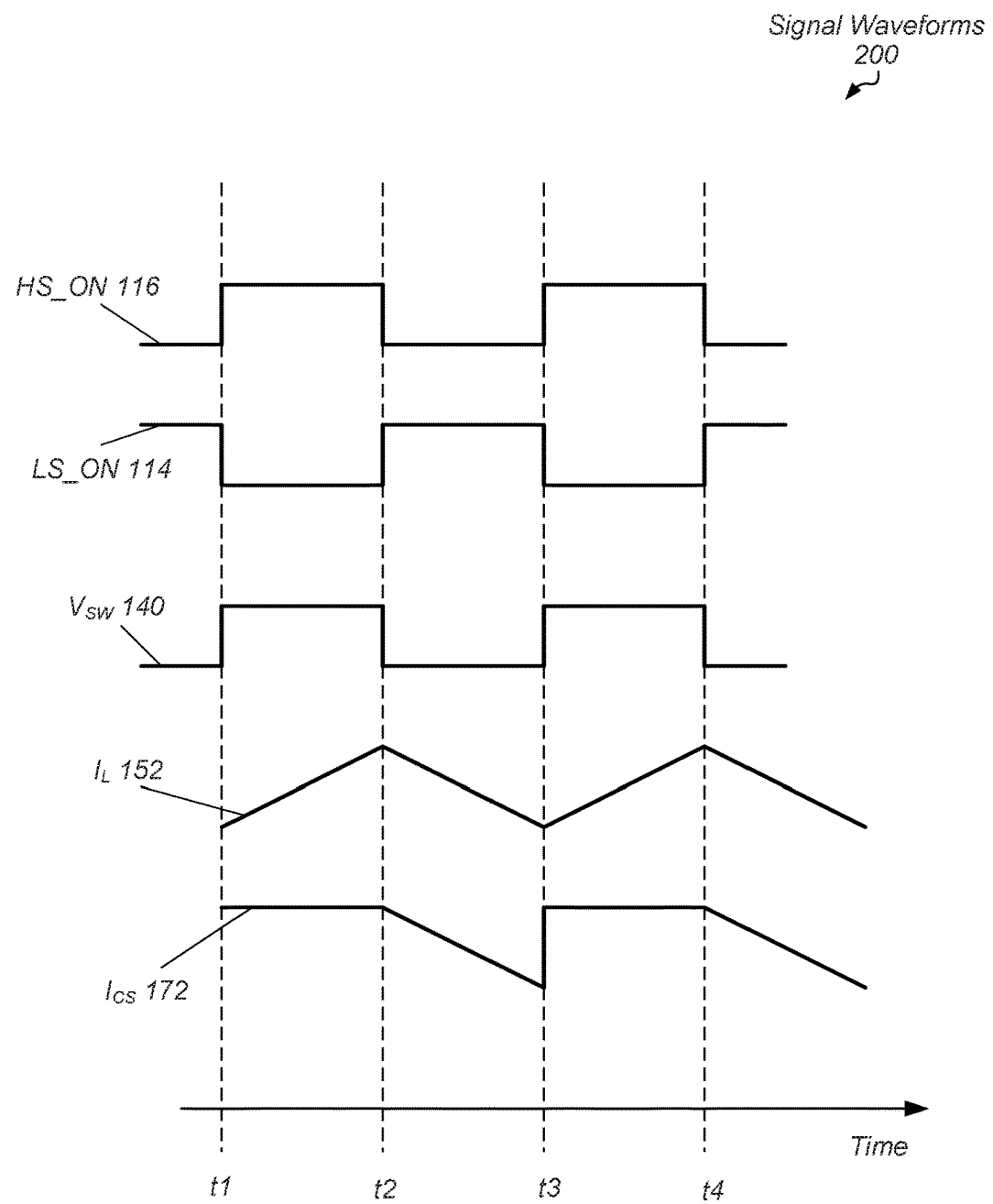
FIG. 2 is a block diagram of one embodiment of signal waveforms for a high current mode of operation for a power converter.

Turning now to FIG. 2, a generalized block diagram of one embodiment of signal waveforms 200 for a high current mode of operation for a power converter is shown. In the illustrated embodiment, signal waveforms described earlier are numbered identically. As described earlier, the average value of the inductor current $I_L$ 152 is the value of the supplied load current. When one or more of the load current and $I_L$ 152 are above a given threshold, the corresponding power converter operates in a high current mode. As shown, the signal $V_{SW}$ 140 is a square wave alternating between the value of the power supply $V_{IN}$ 130 and the ground reference when the power converter operates in the high current mode.

As described earlier, the output of the power converter 100, which is the signal $V_{OUT}$ 162 (not shown here) is an average of the voltage signal $V_{SW}$ 140 due to the low pass filter created by the pair of the inductor 150 and the capacitor 160. Therefore, the output signal $V_{OUT}$ 162 is the multiplicative product of the peak voltage for the signal $V_{SW}$ 140 and the duty cycle of the signal $V_{SW}$ 140. In the high current mode, when the signal $V_{SW}$ 140 has a logic high value, such as between time t1 and time t2, it means the controller 110 turned on the high side transistor 132, which is a p-type FET in one embodiment. Accordingly, the digital signal HS_ON 116 is asserted with a logic high value between time t1 and time t2 and sent to the current sensing block 170.

In the high current mode, the controller 110 alternates turning on and off the power FETs 132 and 134. Since the high side transistor 132 is turned on between time t1 and time t2, the low side transistor 134, which is an n-type FET in one embodiment, is turned off. Accordingly, the digital signal LS_ON 114 is negated with a logic low value between time t1 and time t2 and sent to the current sensing block 170.

Between time t2 and time t3, the signal $V_{SW}$ 140 has a logic low value. Between time t2 and time t3, the controller 110 turned on the low side transistor 134, which is an n-type FET. Accordingly, the digital signal LS_ON 114 is asserted with a logic high value between time t2 and time t3 and sent to the current sensing block 170. Since the low side transistor 134 is turned on, the high side transistor 132, which is a p-type FET, is turned off between time t2 and time t3. Accordingly, the digital signal HS_ON 116 is negated with a logic low value between time t2 and time t3 and sent to the current sensing block 170. The alternating of each of the signal $V_{SW}$ 140 and the digital signals HS_ON 116 and LS_ON 114 continues as long as the power converter 100 is in the high current mode. For example, between time t3 and t4, each of the signals $V_{SW}$ 140 and HS_ON 116 again have logic high values as they did between time t1 and t2 while the signal LS_ON 114 again has a logic low value.

In order to generate the non-zero, positive load current, the power converter 100 generates the inductor current $I_L$ 152. As described earlier, the average value of the inductor current $I_L$ 152 is the value of the supplied load current. Therefore, the average value of the triangular waveform for the inductor current $I_L$ 152 is the value of the supplied load current. Accordingly, the peak of the inductor current $I_L$ 152 exceeds the value of the supplied load current and the valley (lowest value) of the inductor current $I_L$ 152 is below the value of the supplied load current.

As shown, between time t1 and t2 when the high side transistor 132 is turned on and the low side transistor 134 is turned off, the inductor current $I_L$ 152 ramps up. Between time t2 and t3, when the high side transistor 132 is turned off and the low side transistor 134 is turned on, the inductor current $I_L$ 152 ramps down. The alternating of the ramping up and the ramping down of the inductor current $I_L$ 152 continues as long as the power converter 100 is in the high current mode. For example, between time t3 and t4, the inductor current $I_L$ 152 again ramps up.

When the signal LS_ON 114 has a logic low value, the signal $V_{SW}$ 140 is disconnected from the circuit sensing block 170 and the replica current $I_{CS}$ 172 is reset to a direct current (DC) non-zero, positive value. As can be seen in FIG. 2, the replica current $I_{CS}$ 172 has a DC value when the signal LS_ON 114 has a logic low value such as between times t1 and t2 and between times t3 and t4. In contrast, when the signal LS_ON 114 has a logic high value, the signal $V_{SW}$ 140 is connected to the circuit sensing block 170 and the replica current $I_{CS}$ 172 tracks the inductor current 152. As can be seen in FIG. 2, the replica current $I_{CS}$ 172 follows the inductor current $I_L$ 152 when the signal LS_ON 114 has a logic high value such as between times t2 and t3 and after time t4. In various embodiments, when the signal LS_ON 114 has a logic high value, the replica current $I_{CS}$ 172 is proportional to the inductor current 152 and smaller than the inductor current 152. In the high current mode, the zero detection signal ZD 174 and the limit signal $I_{LIM}$ 176 have logic low values.

Figure 3:
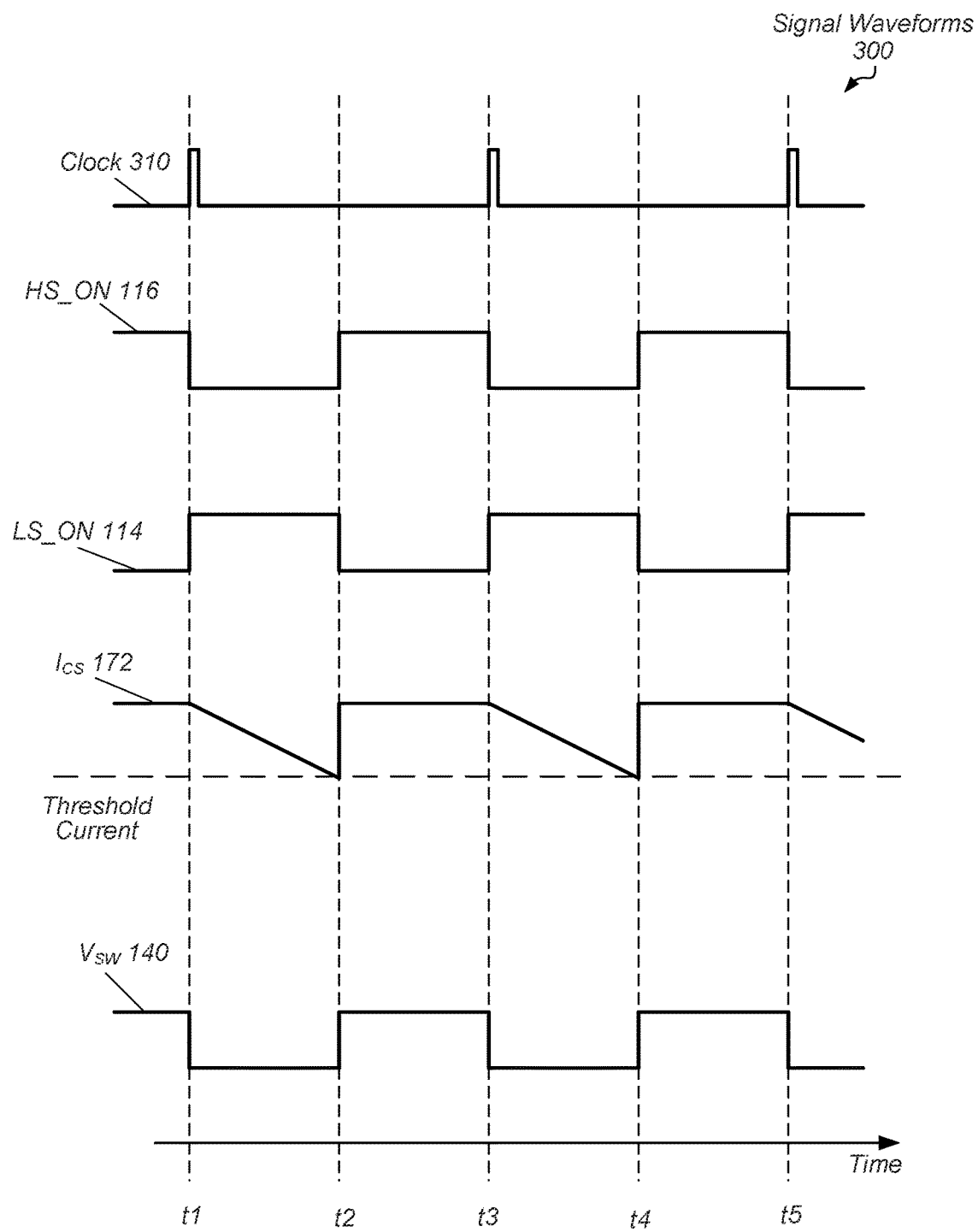
FIG. 3 is a block diagram of one embodiment of signal waveforms for generating control signals for the high current mode of operation for a power converter.

Turning now to FIG. 3, a generalized block diagram of one embodiment of signal waveforms 300 illustrating the generation of control signals is shown. The generation of control signals is also referred to as the pulse width modulation (PWM) mode. In the illustrated embodiment, signal waveforms described earlier are numbered identically. A clock signal 310 is shown along with the control signals HS_ON 116 and LS_ON 114 as well as the replica current signal $I_{CS}$ 172. In some embodiments, the clock signal 310 has a fixed frequency. When the rising edge of the clock signal 310 is reached, the control signal LS_ON 114 transitions from a logic low value to a logic high value. Consequently, the low side transistor 134 turns on and discharges the node connected to its drain terminal, which causes the signal $V_{SW}$ 140 to transition to a logic low value. Simultaneously, the control signal HS_ON 116 transitions from a logic high value to a logic low value. Consequently, the high side transistor 132 turns off. The replica current $I_{CS}$ 172 follows the inductor current $I_L$ 152 (not shown here) and ramps down when the signal LS_ON 114 has a logic high value such as between times t1 and t2, between times t3 and t4, and after time t5.

As shown, when the replica current $I_{CS}$ 172 falls below an amount of current equal to a current threshold, the control signal LS_ON 114 transitions from a logic high value to a logic low value. Consequently, the low side transistor 134 turns off. Simultaneously, the control signal HS_ON 116 transitions from a logic low value to a logic high value. Consequently, the high side transistor 132 turns on and charges the node connected to its drain terminal, which causes the signal $V_{SW}$ 140 to transition to a logic high value.

When the control signal LS_ON 114 has a logic low value, the replica current $I_{CS}$ 172 is reset to a direct current (DC) non-zero, positive value. As can be seen in FIG. 3, the replica current $I_{CS}$ 172 has a DC value when the signal LS_ON 114 has a logic low value such as before time t1, between times t2 and t3, and between times t4 and t5. Therefore, both the duty cycle and the inductor current $I_L$ 152 are controlled by setting the value for the current threshold to compare with the replica current $I_{CS}$ 172. Again, the output signal $V_{OUT}$ 162 of the power converter 100 is the multiplicative product of the peak voltage for the signal $V_{SW}$ 140 and the duty cycle of the signal $V_{SW}$ 140.

Figure 4:
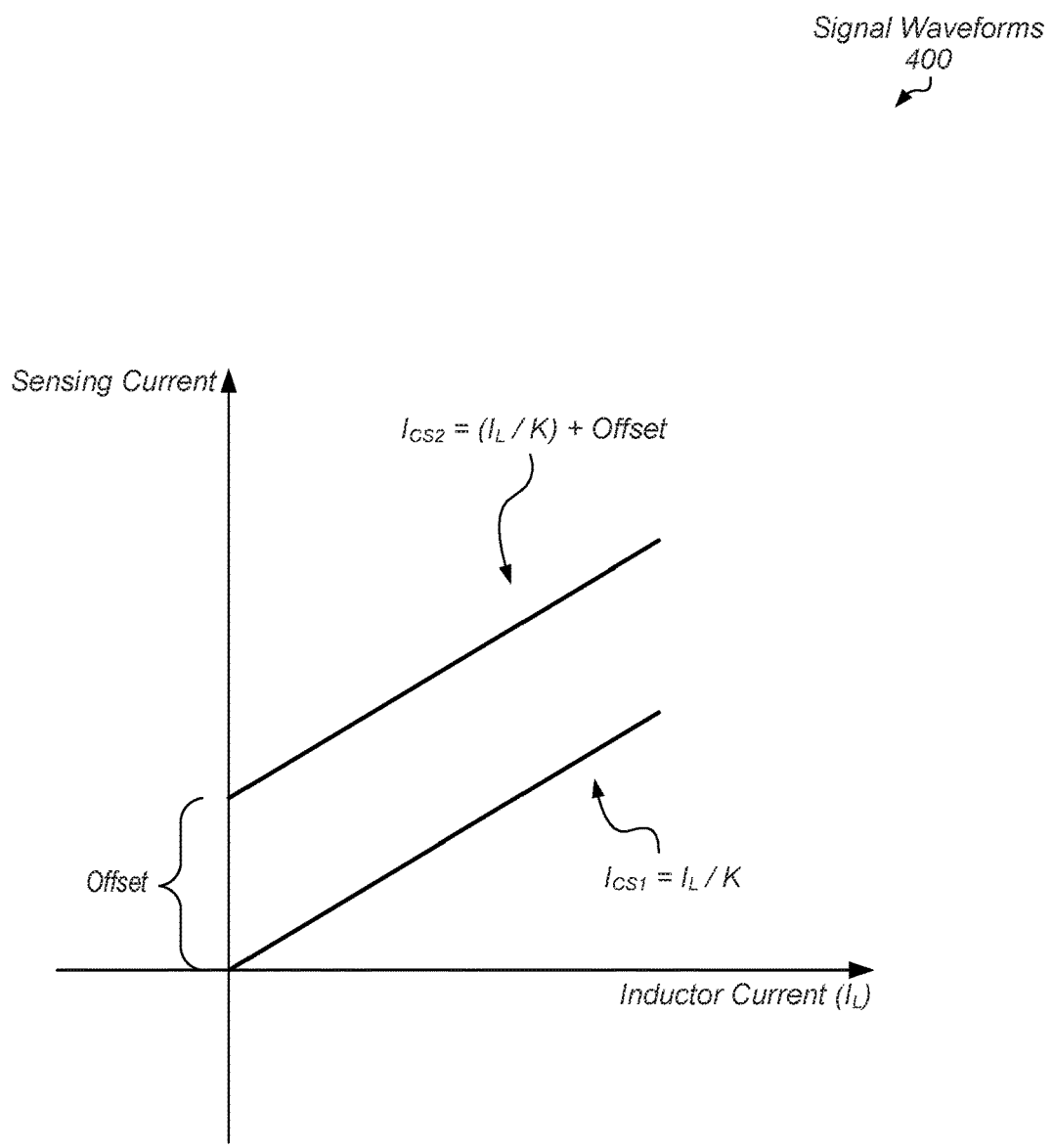
FIG. 4 is a block diagram of one embodiment of signal waveforms for increasing an output current signal by an offset.

Turning now to FIG. 4, a generalized block diagram of one embodiment of signal waveforms 400 for increasing an output current signal by an offset is shown. In the illustrated embodiment, two current signals are shown over time. A first current signal, which is labeled as $I_{CS1}$ and it is a sensing output current, follows an inductor current $I_L$. The current $I_{CS1}$ is also scaled down from the value of the inductor current $I_L$ by a factor K. Accordingly, it can be seen from the diagram that $I_{CS1}$ becomes zero when the inductor current is zero amperes.

In contrast, the second current signal, which is labeled as $I_{CS2}$, is also proportional to the inductor current $I_L$, but $I_{CS2}$ does not fall below zero amperes. Although $I_{CS2}$ has a slope equal to the slope of $I_{CS1}$, the signal $I_{CS2}$ has an additional Offset which prevents it from reaching zero amperes. Each of the factor K and the Offset maintain $I_{CS2}$ as a positive value. Therefore, in various embodiments, $I_{CS2}$ is used to make a zero detection function and a protection function for a power converter relatively simple. For example, each of the zero detection function and the protection function is performed with a relatively simple signal comparison by receiving $I_{CS2}$ as an input rather than receiving $I_{CS1}$. In various embodiments, the value of the Offset is sufficient that even if $I_{CS1}$ falls below zero amperes at a time after time zero, the value of $I_{CS2}$ is still maintained as a positive value above zero amperes. In some embodiments, each of the factor K, the Offset and the resulting $I_{CS2}$ are generated in a current sensing block of the power converter. Further details are provided next.

Figure 5:
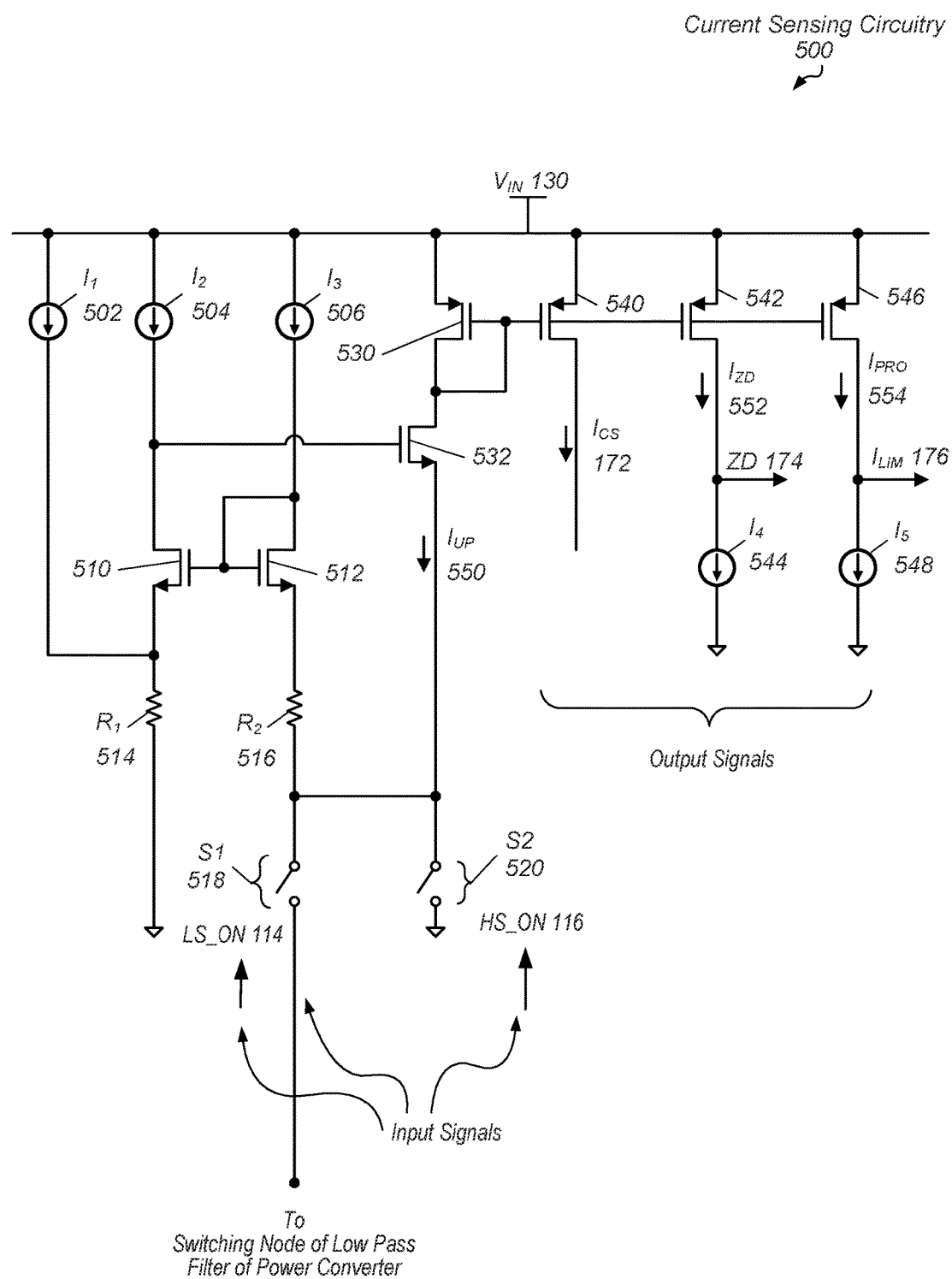
FIG. 5 is a block diagram of one embodiment of current sensing circuitry.

Turning now to FIG. 5, a generalized block diagram of one embodiment of current sensing circuitry 500 is shown. In the illustrated embodiment, signal waveforms described earlier are numbered identically. As shown, the current sensing circuitry 500 includes bias currents $I_1$ 502, $I_2$ 504, $I_3$ 506, $I_4$ 544 and $I_5$ 548. In addition, the current sensing circuitry 500 includes the switches S1 518 and S2 520. As shown, the switch S1 518 is controlled by the control signal LS_ON 114 from the controller 110 within the power converter 100. Similarly, the switch S2 520 is shown to be controlled by the control signal HS_ON 116 from the controller 110 within the power converter 100. Further, the current sensing circuitry 500 includes the resistor $R_1$ 514, the resistor $R_2$ 516 and the transistors 510, 512, 530, 532, 540, 542 and 546.

In the illustrated embodiment, the current sensing circuitry 500 receives $V_{IN}$ 130 as the power supply value and additionally receives the three input signals $V_{SW}$ 140, LS_ON 114 and HS_ON 116. As shown, the current sensing circuitry 500 generates the three output signals $I_{CS}$ 172, ZD 174 and $I_{LIM}$ 176. In an embodiment, the signal $I_{CS}$ 172 is an analog current signal, the signal ZD 174 is a digital voltage signal, and the signal $I_{LIM}$ 176 is a digital voltage signal. In various embodiments, one or more of the bias currents $I_1$ 502, $I_2$ 504, $I_3$ 506, $I_4$ 544 and $I_5$ 548 is generated with current mirrors implemented by devices that are not shown here for ease of illustration. In other embodiments, one or more of the bias currents $I_1$ 502, $I_2$ 504, $I_3$ 506, $I_4$ 544 and $I_5$ 548 is implemented by a resistor with a power supply supplying current through the resistor to generate a given amount of current.

Beginning with the right half of the current sensing circuitry 500, in the illustrated embodiment, each of the transistors 540, 542 and 546 is connected to the diode-connected transistor 530 in a current mirror topology. Each of the transistors 540, 542 and 546 is connected as a current sink transistor in combination with the diode-connected transistor 530 in the current mirror topology. Therefore, there are three output currents based on the reference current flowing through the diode-connected transistor 530, which is $I_{UP}$ 550. The three output currents are shown as $I_{CS}$ 172, $I_{ZD}$ 552 and $I_{PRO}$ 554. As described earlier, $I_{CS}$ 172 is one of the outputs of the current sensing circuitry 500 sent to the controller 110.

The current $I_{ZD}$ 552 is compared to the value of the bias current $I_4$ 544 to implement the zero detection function. The output of the zero detection function is ZD 174. In some embodiments, the value of $I_4$ 544 is set to be equal to the offset used to maintain the output current $I_{CS}$ 172 as a positive value. Any of a variety of current comparison circuits is used to perform the comparison. The devices for the current comparison circuit are not shown for ease of illustration. The current $I_{PRO}$ 554 is compared to the value of the bias current $I_5$ 548 to implement the protection function. The output of the protection function is $I_{LIM}$ 176. In some embodiments, the value of $I_5$ 548 is set to a threshold current value indicating the discharge of the capacitor 160 should be slowed down. Any of a variety of current comparison circuits is used to perform the comparison. Further details of the protection function are provided later in the description of FIG. 7.

Since each of the transistors 540, 542 and 546 is connected to the diode-connected transistor 530 in a current mirror topology, each of the currents $I_{CS}$ 172, $I_{ZD}$ 552 and $I_{PRO}$ 554 is proportional to the reference current $I_{UP}$ 550 flowing through the diode-connected transistor 530. A respective ratio exists between the value of $I_{UP}$ 550 and each of the currents $I_{CS}$ 172, $I_{ZD}$ 552 and $I_{PRO}$ 554. The respective ratio is based on the ratio of the device width of the diode-connected transistor 530 and each of the device widths of the transistors 540, 542 and 546. For example, if the device width of the transistor 542 is double the device width of the diode-connected transistor 530, then the current $I_{ZD}$ 552 flowing through the transistor 542 is twice the amount of the reference current $I_{UP}$ 550 flowing through the diode-connected transistor 530. Next, a description follows of how to make the reference current $I_{UP}$ 550, and accordingly, the replica output current $I_{CS}$ 172 track (follow) the inductor current $I_L$ 152.

As described earlier in FIG. 3, during the high current mode of operation, the output signal $I_{CS}$ 172 follows the inductor current $I_L$ 152 during a portion of the duty cycle of the signal $V_{SW}$ 140. Turning to the left half of the current sensing circuitry 500 in FIG. 5, when the signal LS_ON 114 has a logic low value, the switch S1 518 is turned off (open), which disconnects the signal $V_{SW}$ 140 from the circuit sensing block 170. As shown earlier in the signal waveforms 300 in FIG. 3, the replica current $I_{CS}$ 172 is reset to a direct current (DC) non-zero, positive value. However, when the signal LS_ON 114 has a logic high value, the switch S1 518 in FIG. 5 is turned on (closed), which connects the signal $V_{SW}$ 140 to the circuit sensing circuitry 500. The replica current $I_{CS}$ 172 tracks (follows) the inductor current $I_L$ 152. In various embodiments, the replica current $I_{CS}$ 172 is proportional to the inductor current $I_L$ 152 and smaller than the inductor current $I_L$ 152. The description below describes how the replica current $I_{CS}$ 172 is made proportional to the inductor current $I_L$ 152 and smaller than the inductor current $I_L$ 152.

The transistors 510 and 512 form an amplifier. In the illustrated embodiment, the transistors 510 and 512 are connected in a topology of a current mirror, but transistors 510 and 512 are not directly connected to a power supply or a ground reference. Therefore, the transistors 510 and 512 form an amplifier. Each of the bias currents $I_2$ 504 and $I_3$ 506 are reference currents for the amplifier formed by the transistors 510 and 512. The output current of the amplifier is $I_{UP}$ 550, which flows through the transistor 532. In various embodiments, the transistors 510 and 512 are n-type field effect transistor (FETs) with matching device widths. Therefore, the bias currents $I_2$ 504 and $I_3$ 506 have a same value. The resistor $R_1$ 514 has the sum of the bias currents $I_1$ 502 and $I_2$ 504 flowing through it. When the control signal LS_ON 114 has a logic high value and the control signal HS_ON 116 has a logic low value, the switch S1 518 is closed and the switch S2 520 is open. Consequently, the resistor $R_2$ 516 has the bias current $I_3$ 506 flowing through it.

The bias current $I_1$ 502 is separate from the bias currents $I_2$ 504 and $I_3$ 506 and has a value unrelated to the values of the bias currents $I_2$ 504 and $I_3$ 506. The bias current $I_1$ 502, the resistor $R_1$ 514, the resistor $R_2$ 516 and the on-resistance of the switch S1 518 are used to prevent the output current signal $I_{CS}$ 172 from becoming a negative value even when the inductor current $I_L$ 152 becomes a negative value. By maintaining $I_{CS}$ 172 as a positive value versus allowing $I_{CS}$ 172 to become a negative value, each of the zero detection function and the protection function is performed with a relatively simple signal comparison as described earlier regarding the right half of the current sensing circuitry 500.

In some embodiments, the switch S1 518 is an n-type FET with a device width K times smaller than the device width of the low side transistor 134. Therefore, the on-resistance of the switch S1 518 is K times greater than the on-resistance of the low side transistor 134. As used herein, the on-resistance is a built-in parameter of the transistor representing the internal resistance of the transistor when the transistor is conducting. For field effect transistors (FETs), the on-resistance is the internal resistance between the source and drain terminals through the gate when the transistor is in the saturation state.

The voltage at the drain terminal of the low side transistor 134 is the multiplicative product of the on-resistance of the low side transistor 134 and the inductor current $I_L$ 152. Additionally, the resistor $R_1$ 514 is sized to be the sum of the series combination of the resistor $R_2$ 516 and the on-resistance of the switch S1 518. The following 10 conditions and equations illustrate how the bias current $I_1$ 502, the resistor $R_1$ 514, the resistor $R_2$ 516, the on-resistance of the switch S1 518 and the connection to the signal $V_{SW}$ 140 generate the output signal $I_{CS}$ 172 which follows the inductor current $I_L$ 152 and maintains a positive value for the comparison done in the zero detection function and the protection function. The equations are provided here:

$R_{on}$ is the on-resistance of the low side transistor of a power converter (1)

$V_{SW} = -(R_{on} \times I_L)$ (2)

$(K \times R_{on})$ is the resistance of the closed switch S1 (3)

$R_1 = R_2 + (K \times R_{on})$ (4)

$I_2 = I_3; I_1 \neq (I_2 = I_3); I_1$ is a separate value from $I_2$ and $I_3$ (5)

$[(I_1+I_2) \times R_2] + [(I_1+I_2) \times (K \times R_{on})] = V_{sw} + [(I_2+I_{UP}) \times (K \times R_{on})] + (I_2 \times R_2)$ (6)

$(I_1 \times R_2) + [I_1 \times (K \times R_{on})] = -(R_{on} \times I_L) + [I_{UP} \times (K \times R_{on})]$ (7)

$I_{UP} = I_{CS}$; current mirror uses $I_{UP}$ as reference current and $I_{CS}$ as output current, and device widths match (8)

$I_{CS} = [(I_1 \times R_2) + [I_1 \times (K \times R_{on})] + (R_{on} \times I_L)]/(K \times R_{on})$ (9)

$I_{CS} = (I_L/K) + [I_1 \times [R_2/((K \times R_{on}) + 1)]]$ (10)

$I_{CS} = (I_L/K) + \text{Offset (based on } I_1)$ (10)

As can be seen from the above, if the bias current $I_1$ 502 is removed, then the output signal $I_{CS}$ 172 is the inductor current $I_L$ 152 divided by the factor K. However, with the bias current $I_1$ 502 and additionally the resistors R1 414 and R2 416 and the on-resistance of the switch S1 518, the output signal $I_{CS}$ 172 is shifted up by an offset. The offset allows for each of the zero detection function and the protection function to be done with a relatively simple comparison. Again, each of the zero detection function and the protection function is performed with a relatively simple signal comparison even when each of the load current and the inductor current $I_L$ 152 becomes a negative value. So even if the first term in equation 10, which is $I_L/K$ becomes negative, the second term in equation 10 provides a sufficient offset to generate $I_{CS}$ as a positive value. The earlier waveforms in FIG. 4 graphically show the output signal $I_{CS}$ 172 is shifted up by an offset from the inductor current $I_L$ 152. Additionally, the factor K and any device width ratio scaling in the current mirror reduce the magnitude of the generated output signal $I_{CS}$ 172 in relation to the inductor current $I_L$ 152.

Figure 6:
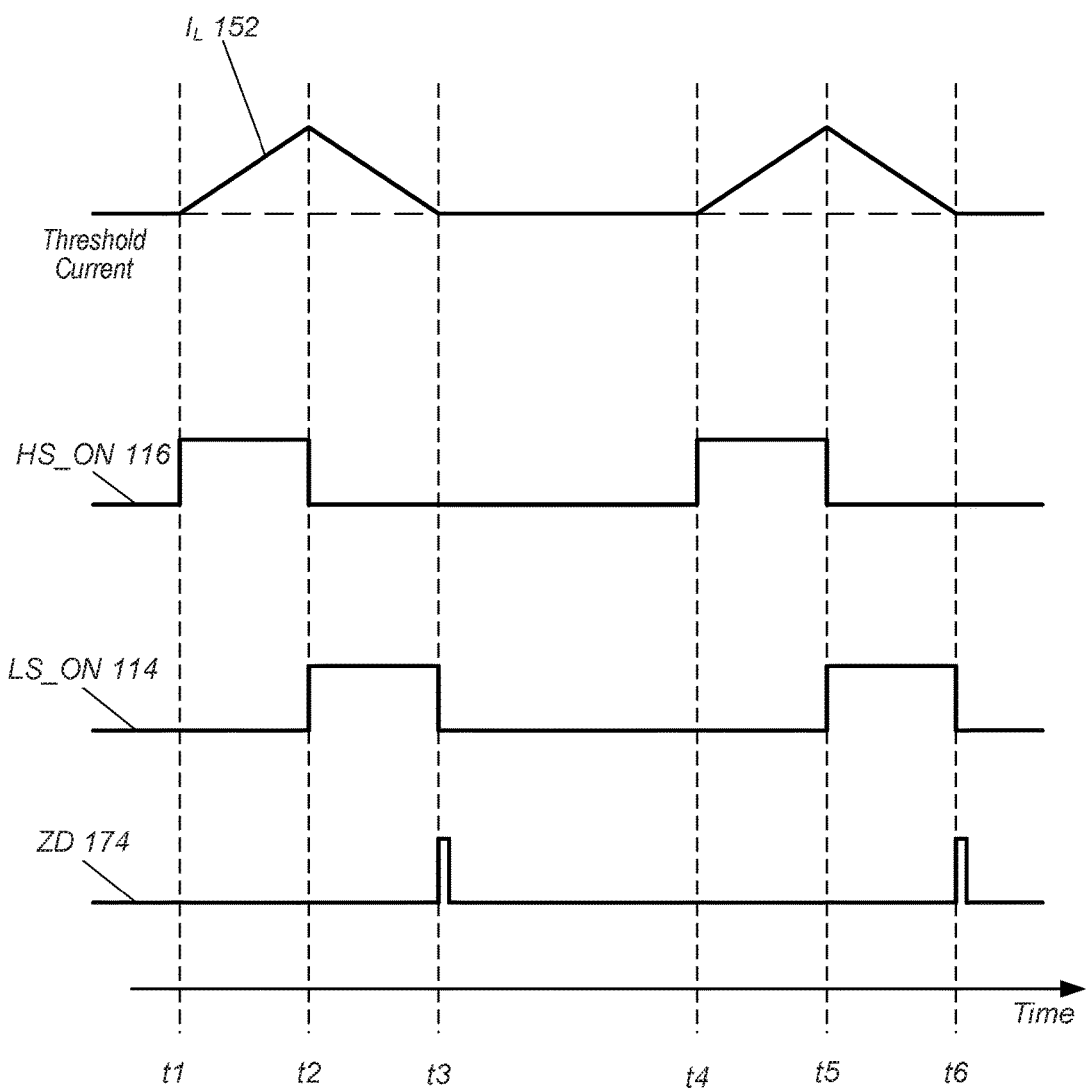
FIG. 6 is a block diagram of one embodiment of signal waveforms for a low current mode of operation for a power converter.

Turning now to FIG. 6, a generalized block diagram of one embodiment of signal waveforms 600 for a low current mode of operation for a power converter is shown. The low current mode is also referred to as a power save mode. In the illustrated embodiment, signal waveforms described earlier are numbered identically. As described earlier, the average value of the inductor current $I_L$ 152 is the value of the supplied load current. When one or more of the load current and the inductor current $I_L$ 152 are below a given threshold, the corresponding power converter operates in a low current mode. However, each of the load current and the inductor current $I_L$ 152 is still a non-zero, positive value. Since the load current and the inductor current $I_L$ 152 are not negative, current is still flowing from the power converter 100 to the load such as one or more components.

The zero detection function is used to prevent the load current and the inductor current $I_L$ 152 from becoming negative and flowing from the one or more components to the power converter 100. When the conductor current $I_L$ 152 reaches an amount of current equal to a current threshold, such as 0 amperes in one embodiment, the control signal ZD 174 transitions to a logic high value, such as a pulse in one embodiment. For example, the inductor current $I_L$ 152 falls between the times t2 and t3, and reaches an amount of current equal to a current threshold at time t3. Consequently, each of the high side transistor 132 and the low side transistor 134 are turned off. Similarly, each of the control signals HS_ON 116 and LS_ON 114 transition to a logic low value at time t3 if not already at the logic low value. With both the high side transistor 132 and the low side transistor 134 turned off, the inductor current $I_L$ 152 remains at the amount of current equal to the current threshold. It is noted that while the embodiments described herein refer to values being "equal" or an amount being "equal" to some value, it is contemplated that the terms encompass being approximately equal and not necessarily precisely equal to a very fine degree. Those skilled in the art appreciate that the technologies described herein have limitations. Given these considerations, whether two values are considered equal will generally be considered within a given tolerance or range.

As shown, after the time t3, the duty cycle of the signal $V_{SW}$ 140 (not shown here) reduces. As described earlier, the output signal $V_{OUT}$ 162 is the multiplicative product of the peak voltage for the signal $V_{SW}$ 140 and the duty cycle of the signal $V_{SW}$ 140. With the duty cycle decreasing, the output signal $V_{OUT}$ 162 for the power converter 100 also reduces. In some embodiments, the output signal $V_{OUT}$ 162 is sent to the controller 110 and compared to a threshold voltage with a voltage comparator. When the output signal $V_{OUT}$ 162 reaches or falls below the threshold voltage, the high side transistor 132 is turned on again and the control signal HS_ON 116 transitions to a logic high value such as at time t4. Accordingly, the inductor current $I_L$ 152 rises, which causes the load current to rise and the output signal $V_{OUT}$ 162 to also rise. Afterward, the control signal LS_ON 114 transitions to a logic high value, such as at the time t5, with the rising edge of the clock signal 310 (not shown here). In some embodiments, the control signal LS_ON 114 does not react to the rising edge of the clock signal 310, such as between the times t3 and t4, when the inductor current $I_L$ 152 reaches the amount of current equal to the current threshold. In an embodiment, a state machine in the controller 110 suppresses the control signal LS_ON 114 despite the rising edges of the clock signal 310.

Figure 7:
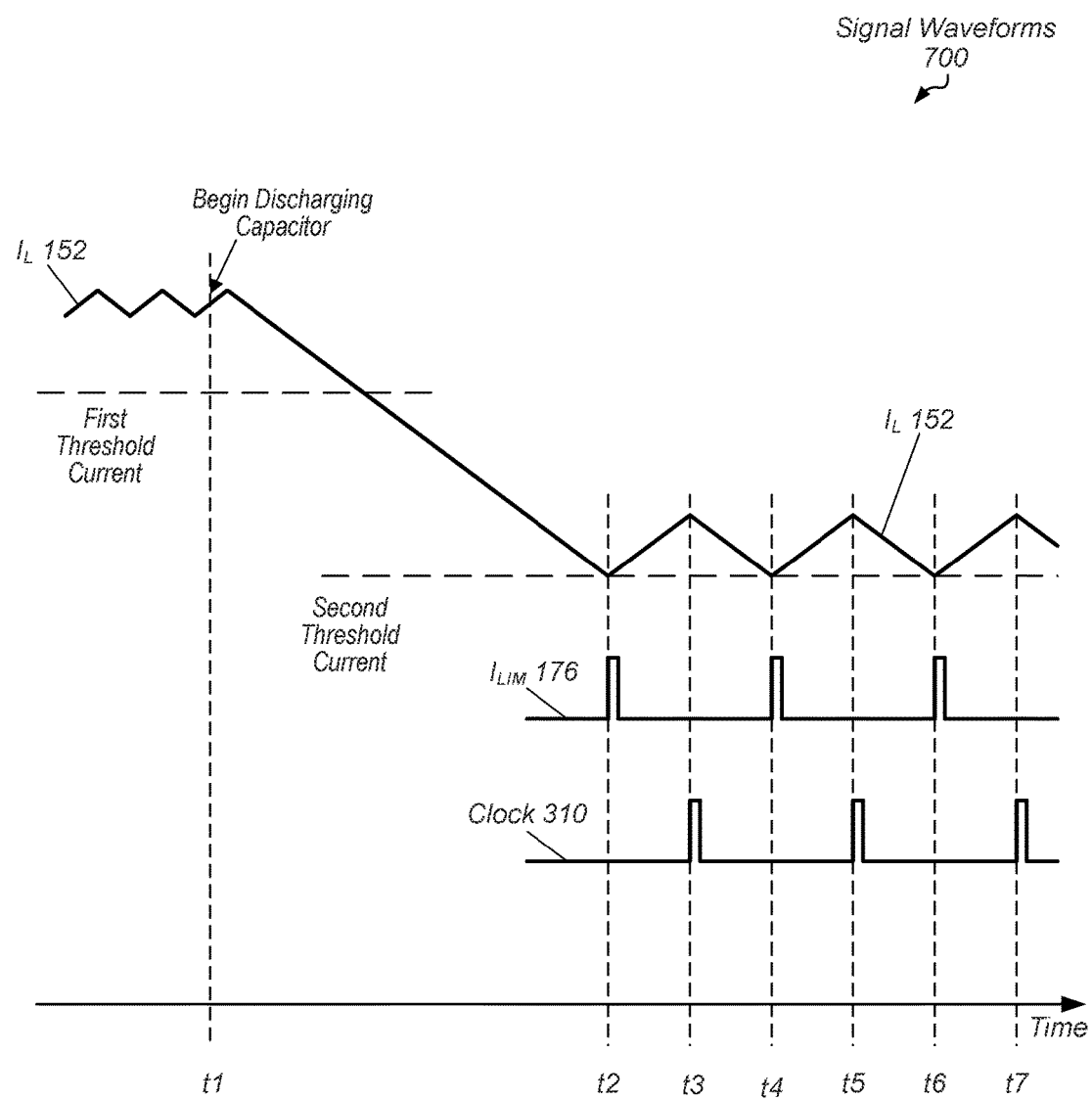
FIG. 7 is a block diagram of one embodiment of signal waveforms for discharging a capacitor in a power converter at a controlled rate.

Turning now to FIG. 7, a generalized block diagram of one embodiment of signal waveforms 700 is shown. In the illustrated embodiment, signal waveforms described earlier are numbered identically. The capacitor 160 is purposely discharged during at least two conditions. A first condition is when the power converter 100 is turned off. A second condition is when it is determined that the regulated output voltage ($V_{OUT}$) 162 exceeds a target output voltage. In some embodiments, the voltage comparison occurs in the controller 110. One of these at least two conditions is satisfied at time t1. It is possible for the capacitor 160 of the output low pass filter to have a significant amount of charge stored on it. In order to protect the circuitry of the power converter 100, the capacitor 160 is discharged at a controlled rate. For example, after one of the at least two conditions is satisfied, the high side transistor 132 is turned off and the low side transistor 134 is turned on in order to being discharging the capacitor 160 at a controlled rate. Accordingly, the inductor current $I_L$ 152 falls as shown.

As the inductor current $I_L$ 152 falls, it is still a positive value. Therefore, each of the inductor current $I_L$ 152 and the load current still flow from the power converter 100 to the load of one or more components. In an embodiment, the first threshold current is 0 amperes. When the inductor current $I_L$ 152 falls below this value, the direction of each of the load current and the inductor current 152 is from the one or more components to the power converter 100. A second threshold current is set to protect the circuitry of the power converter 100. When the inductor current $I_L$ 152 reaches or falls below the second threshold current, such as at time t2, the control signal $I_{LIM}$ 176 transitions to a logic high value, such as a pulse in one embodiment. Simultaneously, the high side transistor 132 is turned on while the low side transistor 134 is turned off. In various embodiments, since the inductor current $I_L$ 152 is negative, the direction of the flow of the current is still from the one or more components to the power converter 100 despite the inductor current $I_L$ 152 is ramping up. The amplitude of the inductor current $I_L$ 152 is reducing while still flowing from the one or more components to the power converter 100.

At time t3, the rising edge of the clock signal 310 is reached and the control signal LS_ON 114 (not shown here) transitions from a logic low value to a logic high value. Simultaneously, the low side transistor 134 is turned on while the high side transistor 132 is turned off. In various embodiments, since the inductor current $I_L$ 152 is negative, the magnitude of the inductor current $I_L$ 152 increases while the direction of the flow of the current continues from the one or more components to the power converter 100. Additionally, the capacitor 160 continues to discharge, but at a controlled rate.

Figure 8:
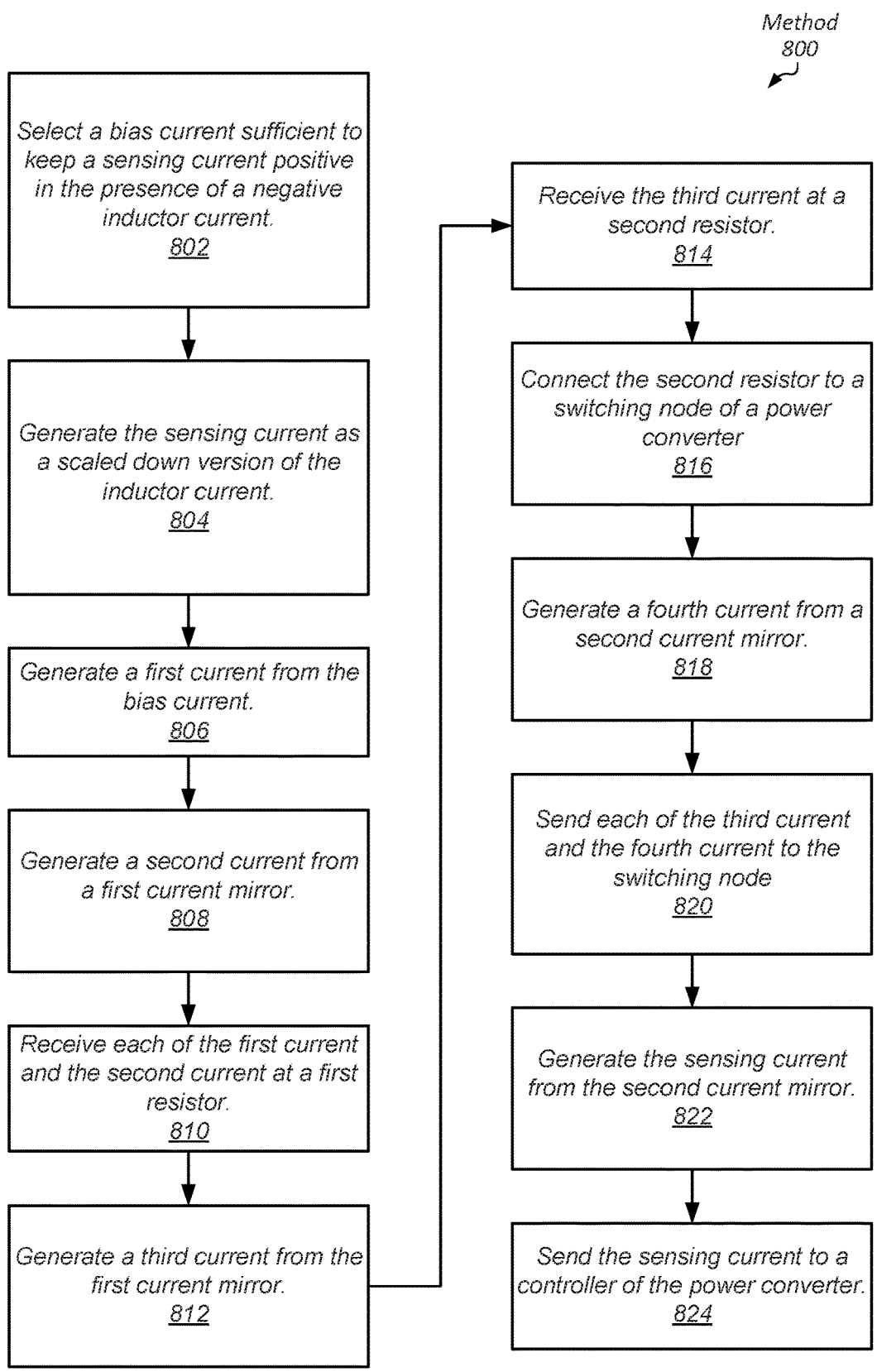
FIG. 8 is a flow diagram of one embodiment of a method for efficiently generating a stable output voltage for one or more components.

Referring now to FIG. 8, a generalized flow diagram of one embodiment of a method 800 for efficiently generating a stable output voltage for one or more components is shown. For purposes of discussion, the steps in this embodiment are shown in sequential order. However, in other embodiments some steps may occur in a different order than shown, some steps may be performed concurrently, some steps may be combined with other steps, and some steps may be absent.

A power converter receives an input voltage and generates an output voltage on a capacitor of a low pass filter. The power converter includes two power transistors connected in series with an output connected to the low pass filter. An inductor current flows through whichever one of the two power transistors is on as well as the inductor of the low pass filter. A driver within the power converter turns on and off the two power transistors based on at least a sensing current sent by a current sensing block. The current sensing block includes one or more current mirrors in addition to at least a first resistor, a second resistor, a switch and a bias current source. A size for a bias current source is selected to be a sufficient offset to maintain the sensing current as a positive value even when a related inductor current is negative (block 802). For example, in some embodiments, the sensing current is equal to the inductor current divided by the factor K. If a peak negative value of the inductor current is known or found during design and testing stages, and the factor K is set, then an offset and accordingly the bias current value are determined. For example, expressions, such as the earlier conditions and equations 1-10, are used to determine the target value for K and the amount of current generated by the bias current source.

Sizes are selected for a first resistor, a second resistor and a switch to provide the offset and to generate the sensing current as a scaled down version of the inductor current (block 804). The sizing is based on the circuit topology. For example, when the topology of the earlier current sensing circuitry 500 is used, the earlier conditions and equations 1-10 are used to determine the factor K, which is how much smaller the sensing current is compared to the inductor current. In one example, when K is 1,000 and the inductor current is 3 amperes (A), the sensing current is 3 milliamperes (mA). For the first resistor, the second resistor and the switch, in some embodiments, the earlier conditions 1, 3 and 4 are used for selecting sizes.

A first current is generated from the bias current source (block 806). A second current is generated from a source terminal of a current sink transistor of a first current mirror (block 808). Each of the first current and the second current is received at a first resistor (block 810). A third current is generated from a source terminal of a diode-connected transistor of the first current mirror (block 812). The third current is received at a second resistor (block 814). The second resistor is connected to a switching node of the power converter through the switch, which is closed (block 816). The switching node is the output of the two power transistors. A voltage of the switching node is based on an inductor current flowing through the low pass filter.

A fourth current is generated from a drain terminal of a diode-connected transistor of a second current mirror (block 818). Each of the third current and the fourth current is sent to the switching node through the closed switch (block 820). The sensing current is generated from a drain terminal of a current sink transistor of the second current mirror (block 822). In some embodiments, the second current mirror uses the fourth current as a reference current and generates the sensing current as the output current. When the device widths of the diode-connected transistor of the second current mirror and the current sink transistor of the second current mirror match, the sensing current equals the fourth current. With a non-unity ratio between the device widths, the sensing current is a scaled version of the fourth current based on the non-unity ratio.

The sensing current is sent to a controller of the power converter (block 824). In some embodiments, additional transistors are connected as current sink transistors to the diode-connected transistor of the second current mirror. The outputs of these additional transistors are scaled in a similar manner as for the sensing current. A unity ratio and non-unity ratios between the devices widths are possible and contemplated for scaling the corresponding output currents in relation to the fourth current used as a reference current in the second current mirror. In an embodiment, one of the additional output currents is used in a zero detect function, which compares this additional output current to an amount of current representing the inductor current has zero amperes. In one embodiment, a second current of the additional output currents is used in a protection function, which compares this additional output current to an amount of current representing the inductor current has reached a particular negative amount of current indicating the inductor current is flowing from one or more components into the power converter.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. A current sensing circuit comprising:
   an amplifier configured to convey each of a reference current and an output current;
   a first current mirror configured to:
      receive the output current from the amplifier; and
      generate a sensing output current;
   a bias current source configured to convey a bias current;
   a first resistor with a first node configured to receive each of the bias current and the reference current, wherein the first resistor and the bias current source boosts the sensing output current by an amount equal to at least the bias current; and
   a second resistor with a second node configured to receive the reference current from the amplifier and a third node connected to a switching node input of a low pass filter through a switch when the switch is closed.

2. The current sensing circuit as recited in claim 1, wherein an on-resistance of the switch is greater than an on-resistance of a low side transistor of two power transistors configured to change a voltage on the switching node.

3. The current sensing circuit as recited in claim 2, wherein the sensing output current is smaller than an inductor current flowing in the low pass filter.

4. The current sensing circuit as recited in claim 2, wherein the first resistor has a resistance equal to the sum of a resistance of the second resistor and the on-resistance of the switch.

5. The current sensing circuit as recited in claim 1, further comprising a second current mirror configured to:
   receive the output current from the amplifier; and
   generate a zero detect current.

6. The current sensing circuit as recited in claim 5, further comprising a first current comparator, wherein in response to determining the zero detect current falls below a first threshold current, the first current comparator generates a logic high value for a zero detect output.

7. The current sensing circuit as recited in claim 1, further comprising a third current mirror configured to:
   receive the output current from the amplifier; and
   generate a protection current.

8. The current sensing circuit as recited in claim 7, further comprising a second current comparator, wherein in response to determining the protection current falls below a second threshold current, the second current comparator generates a logic high value for a protection output.

9. A method comprising:
   conveying each of a reference current and a first output current from an amplifier;
   receiving the output current from the amplifier at a first current mirror;
   generating a sensing output current at the first current mirror;
   conveying a bias current from a bias current source;
   receiving each of the bias current and the reference current from the amplifier at a first node of a first resistor;
   boosting the sensing output current by an amount equal to at least the bias current with the first resistor and the bias current source;
   receiving the reference current from the amplifier at a second node of a second resistor; and
   connecting a third node of the second resistor to a switching node input of a low pass filter through a switch when the switch is closed.

10. The method as recited in claim 9, wherein an on-resistance of the switch is greater than an on-resistance of a low side transistor of two power transistors configured to change a voltage on the switching node.

11. The method as recited in claim 10, wherein the sensing output current is smaller than an inductor current flowing in the low pass filter.

12. The method as recited in claim 10, wherein the first resistor has a resistance equal to the sum of a resistance of the second resistor and the on-resistance of the switch.

13. A power converter comprising:
   two power transistors connected in series with an output connected to a switching node;
   a controller configured to turn on and off the two power transistors to change a voltage of a switching node input of a low pass filter;
   a current sensing circuit configured to generate a sensing output current based on an inductor current flowing in the low pass filter, wherein the current sensing circuit comprises:
      an amplifier configured to convey each of a reference current and an output current;
      a first current mirror configured to:
         receive the output current from the amplifier; and
         generate the sensing output current;
      a bias current source configured to convey a bias current;
      a first resistor with a first node configured to receive each of the bias current and the reference current, wherein the first resistor and the bias current source boosts the sensing output current by an amount equal to at least the bias current; and
      a second resistor with a second node configured to receive the reference current from the amplifier and a third node connected to a switching node input of a low pass filter through a switch when the switch is closed.

14. The power converter as recited in claim 13, wherein an on-resistance of the switch is greater than an on-resistance of a low side transistor of two power transistors configured to change a voltage on the switching node.

* * * * *